United States Patent [19]

Ohta et al.

[11] Patent Number: 5,108,515
[45] Date of Patent: Apr. 28, 1992

[54] THERMOELECTRIC MATERIAL AND PROCESS FOR PRODUCTION THEREOF

[75] Inventors: Toshitaka Ohta; Takenobu Kajikawa, both of Tsukuba; Takashi Uesugi; Takeo Tokiai, both of Sodegaura, all of Japan

[73] Assignees: Director-General, Agency of Industrial Science and Technology; Ministry of International Trade, Tokyo, Japan

[21] Appl. No.: 432,125

[22] Filed: Nov. 6, 1989

[30] Foreign Application Priority Data

Nov. 15, 1988 [JP] Japan ................................ 63-286869
Jul. 10, 1989 [JP] Japan ................................ 1-175517
Jul. 10, 1989 [JP] Japan ................................ 1-175518

[51] Int. Cl.$^5$ ...................... H01L 35/34; H01L 37/00
[52] U.S. Cl. .................................. 136/201; 136/238; 136/240; 419/38; 419/58
[58] Field of Search .............. 136/200, 201, 237, 238, 136/239, 240, 241, 242; 419/38, 39, 58; 420/577

[56] References Cited

U.S. PATENT DOCUMENTS

| 3,051,567 | 8/1962 | Ziegler | 75/214 |
| 3,095,330 | 6/1963 | Epstein et al. | 136/5 |
| 3,129,117 | 4/1964 | Harding, Jr. et al. | 136/5 |
| 3,208,878 | 9/1965 | Donahoe | 136/4 |
| 3,853,550 | 12/1974 | Nikolaev et al. | 75/213 |
| 4,483,820 | 11/1984 | Schelb | 419/28 |
| 4,588,520 | 5/1986 | Jayadev et al. | 252/512 |
| 4,612,162 | 9/1986 | Morgan et al. | 419/28 |
| 4,681,629 | 7/1987 | Reinshagen | 75/246 |

FOREIGN PATENT DOCUMENTS 0115950 8/1984 European Pat. Off. .
2532786 9/1984 France .
59-143383 8/1984 Japan .

OTHER PUBLICATIONS

Patent Abstracts of Japan, vol. 13, No. 23 (E-705), Sep. 21, 1988; JP-A-63226980 (Seiko Instr & Electronics Ltd) Jan. 19, 1989 *Abstract.

Ohta et al., "Pulverized and Intermixed Elements Sintering Method on (Bi, Sb)$_2$(Te, Se)$_3$ Based N-Type Thermoelectric Devices", 8th Int. Conference on Thermoelectric Conversion, Jul. 1989, pp. 7-11.

Mechtly, E. A., *The International System of Units-Physical Constants and Conversion Factors*, 1973, pp. 1-5.

Bhandari, C. M. and D. M. Rowe, *Thermal Conduction in Semiconductors*, 1988, pp. 1-6, John Wiley & Sons.

*Primary Examiner*—Brooks H. Hunt
*Assistant Examiner*—Chrisman D. Carroll
*Attorney, Agent, or Firm*—Frishauf, Holtz, Goodman & Woodward

[57] ABSTRACT

A thermoelectric material can be obtained by co-pulverizing and mixing a material containing at least bismuth and a material containing at least tellurium, without being alloyed by melting, and then molding and sintering. This thermoelectric material has high performance and can be utilized in a variety of fields such as thermoelectric power generation and thermoelectric cooling, a temperature sensor space development, marine development, and electric power generation in the remote areas. Since metal elements are used as a starting material, the starting material can be easily prepared. Moreover, in the production steps, the thermoelectric material can be produced in a high yield at a low energy consumption level by a simplified manner, without a complicated operation or special apparatus, and its production cost can be decreased.

30 Claims, No Drawings

THERMOELECTRIC MATERIAL AND PROCESS FOR PRODUCTION THEREOF

BACKGROUND OF THE INVENTION

1. Field of the Invention

The present invention relates to a thermoelectric material and a process for production thereof. More particularly, the present invention relates to a thermoelectric material having high performance and a process in production steps and is industrially advantageous.

2. Description of the Related Arts

A thermoelectric material for thermoelectric power generation utilizing the Seebeck effect or thermoelectric cooling utilizing the Peltier effect is widely used in various fields, for example, thermoelectric power generation, temperature sensors, thermostatic apparatus in a semiconductor production process, and cooling of electronic devices. For production of such thermoelectric materials, various methods have heretofore been proposed. For example, (1) a crystal ingot production method in which starting materials are alloyed by melting, converted into an ingot and then sliced, (2) a powder sintering method in which a starting material powder or starting materials which have been alloyed by melting and then powdered, are molded and sintered, and sliced, if necessary, (3) a polycrystallization-zone melting method, (4) an amorphous production method, and (5) a thin or thick film production method are known.

These methods, however, have problems in that the process is complicated, a long term treatment of alloying by melting at high temperatures is needed, productivity is low and energy consumption is high. In methods including a slicing step, the slice loss results, and in the polycrystallization-zone melting method, undesirable electrical or mechanical anisotropy result from crystallization. Moreover, for the reason that supersmall sized elements are difficult to produce, the methods are used only in limited fields.

The conventional methods are limited in molding methods and thus have an intrinsic problem that makes it difficult to get desirable molded shapes by various molding methods.

Japanese Patent Application Laid-Open No. 143383/1984 discloses a method in which mixture of a telluride lead compound and a manganese-based metal powder is molded and sintered in order to overcome the above problems. This method, however, is not quite satisfactory. That is, the conventional methods use a alloyed powder material to mix and mold, and only powders of several tens or several hundreds of microns are used.

SUMMARY OF THE INVENTION

An object of the present invention is to provide a high quality thermoelectric material having an improved figure of merit.

Another object of the present invention is to provide a thermoelectric material which permits production of elements with any desired shape by various molding methods.

Another object of the present invention is to provide a process for producing the above thermoelectric material in a high yield with a low energy consumption level by a simplified manner.

The present invention provides a thermoelectric material obtained by sintering a molding of a mixture prepared by co-pulverizing a material containing at least bismuth and a material containing at least tellurium without alloying by melting. The present invention provides a process for producing a thermoelectric material which comprises co-pulverizing and intermixing a material containing at least bismuth and a material containing at least tellurium, directly, without alloying by melting, and then molding and sintering.

DESCRIPTION OF THE PREFERRED EMBODIMENTS

Raw materials (starting materials) for the above thermoelectric material are those containing at least bismuth and those containing at least tellurium. In addition to bismuth and tellurium, antimony, selenium, an alloy of tellurium and antimony, and the like can be used. These raw materials are preferably in powder form. The particle diameters of the materials are 100 mesh pass, preferably 150 mesh pass. In the case of powders having a large particle diameter, it is preferred to control the particle diameter to be within the above range by such techniques such as grinding. In connection with the type of the raw material and the mixing ratio, various embodiments are considered. Examples are Bi:Te=2:3 (molar ratio), Bi:Sb:Te=2:8:15 (molar ratio), or (Bi+Sb):(Te+Se)=2:3 (molar ratio). Particularly, by compounding bismuth (Bi) or bismuth+antimony (Bi+Sb) and tellurium (Te) or tellurium+selenium (Te+Se) in a ratio of about 2:3, a thermoelectric material, exhibiting excellent performance at temperatures of 600 K or less can be obtained.

As the raw material, metal elements which is not alloyed by melting, or an alloy or a compound which is obtained in the course of scouring can be used as long as it contains the above component.

The above raw material preferably contains a suitable amount of dopants. Dopants used conventionally can be added to the raw material by the usual methods. For example, in production of an n-type (negative type) thermoelectric material, $SbI_3$, $CuTe$, $Cu_2S$, $CuI$, $CuBr$, $AgBr$, etc. can be used. In production of a p-type (positive type) thermoelectric material, Te, Cd, Sb, Pb, As, Bi, etc. can be used. Particularly in the case that bismuth and tellurium are added in a ratio of about 2:3, from viewpoints of solubility and stability, $SbI_3$ is preferably used in the n-type, and Te is preferably used in the p-type. The amount of the dopant added is determined appropriately depending on the type and mixing ratio of the raw material, and the type of a substance as the dopant and the like. It is usually 0.01 to 10 mol % and preferably 0.05 to 5 mol %.

To the raw material or starting material powder which has been co-pulverized and intermixed, a substance having low thermal conductivity (thermal conductivity reducing agent) can be added. The figure of merit can be improved by adding such thermal conductivity reducing agents. Examples of such thermal conductivity reducing agents are $SiO_2$, $TiO_2$, $ZrO_2$, $B_2O_3$, BN, and $Si_3N_4$. The added amount of the thermal conductivity reducing agent is determined depending upon the purpose of use, particularly upon temperatures to which an apparatus is required to cool. It is usually 0.1 to 50% by weight and preferably 0.5 to 30% by weight. By adding a thermal conductivity reducing agent, even if the figure of merit of a thermoelectric material is the same, the thermal conductivity drops and thus cooling to a lower temperature can be achieved.

In the process of the present invention, the raw materials thus compounded are sufficiently mixed by co-pulverizing and intermixing. In this case, it is desirable that pulverization and intermixing are carried out at the same time to further reduce the particle diameter of the raw materials. This pulverizating and intermixing can be carried out simultaneously by various techniques, such as a ball mill, an impact fine pulverization machine, a jet pulverization apparatus and a tower type friction machine. In the case that a ball mill is used as the pulverizating and mixing method, it is preferred that a planetary type ball mill or the similar is used instead of the conventional dropping type ball mill.

Co-pulverization and intermixing can be carried out either in a dry or wet condition. For example, in the case of a wet condition, alcohols such as ethanol or butanol and various solvents can be used as mixing aids. In connection with the mixing power or mixing time in the above co-pulverization and intermixing, they are desirably controlled so that the average particle diameter of the starting material powder after co-pulverization and intermixing is 0.05 to 10 μm, preferably about 0.05 to 7 μm and more preferably 0.05 to 5 μm.

In the process of the present invention, the starting material powder after co-pulverization and intermixing is compression molded into a desired form by means of applying pressure such as press molding without the processing of alloying by melting employed conventionally. This compression molding can be carried out by adding a binder component such as polyvinyl alcohol, if necessary. The pressure at the time of compression molding is usually 0.2 to 20 ton/cm² and preferably 0.5 to 16 ton/cm² although it varies with the type and particle diameter of the starting material powder.

As molding methods, in addition to he above compression molding, any desired molding methods such as hot press, extrusion molding, injection molding, coating and a screen printing method can be employed.

In the process of the present invention, it is necessary to apply sintering after the above molding. A sintered product obtained exhibits high performance as a thermoelectric material. This sintering is applied to a molding obtained by the above molding, under reduced pressure or atmospheric pressure, or under pressure, specifically in the range of $10^{-3}$ to $10^6$ Torr in an inert gas such as argon or nitrogen. The sintering temperature is chosen appropriately depending on the type and mixing ratio of the starting material, and so forth, and it is usually 300° to 600° C. and preferably 400° to 520° C. The heating-up rate, particularly at a temperature exceeding 200° C., and especially 400° C. is preferably controlled to not more than 10 K/hr. If the temperature is raised at a higher rate, the thermoelectric material obtained sometimes has reduced performance. If the heating-up rate is too slow, a long time is needed to reach a predetermined temperature. For example, it is suitable to control the speed to about 3 to 10 K/hr. The time of heating-up varies with the atmosphere under pressure and the composition, and is not necessarily limited to the above range.

When the predetermined sintering temperature is reached at the above heating-up rate, the green molding is maintained at the temperature for the time needed to thereby sinter it, whereupon the desired thermoelectric material is obtained. This sintering time is usually 0.5 to 30 hours.

In the process of the present invention, the figure of merit can be further increased by carrying out the above sintering treatment in a sealed condition. The term "sealed condition" as used herein means that the green molding is not exposed to the atmosphere during sintering. For example, the sealed condition can be produced by sealing the green molding in an ampule. The surrounding gas at the time of sintering may comprise only one generated from the molding. The surrounding gas comprises other one, preferably inert gas, and more preferably reducing gas or a mixed gas of reducing gas and inert gas. As the inert gas, Ar (argon) is preferably used, and as the reducing gas, $H_2$, CO and the like are preferably used.

In sintering under a pressure of more than atmospheric pressure, it suffices that sintering with gas pressure in a non-oxidizing atmosphere is carried out. When sintering is carried out under a pressure of not more than atmospheric pressure, it suffices that a green molding is placed in a sealed container such as an ampule and after setting it at a predetermined pressure corresponding to a pressure increase generated by raising the sintering temperature, sintering is carried out at raised temperature. In the case of reduced pressure (i.e., under a pressure of not more than atmospheric pressure), it is preferred for the sintering to be carried out in the presence of reducing gas. The reason why reducing gas is used as a preferred embodiment of the present invention is that the co-pulverized and intermixed starting material powder is relatively small in particle diameter and, as a result, is readily subject to oxidation and, therefore, the reducing gas is used to reduce the material.

In the process of the present invention, it is preferred that sintering is carried out under a pressure of not more than atmospheric pressure. Although the reason for this is not clear, it is considered that a thermoelectric material obtained by sintering is decreased in density and is reduced in thermal conductivity.

The thermoelectric material thus sintered is preferably annealed at a temperature of 50° to 200° C. below the sintering temperature for a period of 0.5 to 30 hours, if necessary. This annealing can be carried out in a reducing atmosphere and preferably in a sealed condition. In carrying out the reduction treatment in sintering or annealing, no special additional steps are needed, and it suffices that the sintering or annealing is carried out in a reducing atmosphere.

In the process of the present invention, the figure of merit can be increased by carrying out the reduction treatment in at least any of co-pulverizing and intermixing, sintering and annealing in the course of production of the above thermoelectric material. The reduction treatment usually proceeds by heating in a reducing gas such as $H_2$ or CO. In this reduction treatment, a mixed gas of the above reducing gas and inert gas such as Ar can be used. The reduction treatment is not critical in operation and can be carried out in various manners.

Pressure conditions in the reduction treatment are not critical. When the reduction treatment is carried out at the time of sintering or annealing, it is preferably carried out in a sealed condition.

In the present invention, a thermoelectric material can be easily obtained by co-pulverizing and intermixing metal elements as starting materials (particularly by the use of a planetary type ball mill), molding and then sintering. Particularly, since a powder element is used as a starting material, starting materials can be easily prepared. Moreover, the thermoelectric material can be easily produced without a complicated operation or a special apparatus, and thus the production cost of the thermoelectric material can be reduced. Furthermore, the figure of merit can be improved by choosing specified sintering conditions.

The present invention has the feature that any suitable molding method, not only compression molding but also hot press, extrusion molding, coating or screen printing method, can be employed to produce a product in a desired form.

The thermal conductivity $\kappa$ of the thermoelectric element produced by the process of the present invention is not more than 1.4 $Wm^{-1}K^{-1}$ and particularly 0.7 to 1.3 $Wm^{-1}K^{-1}$. Thus the thermoelectric element has the feature that it has lower thermal conductivity than that of the conventional thermoelectric element. The reason for this is considered that grain growth is less likely to occur at the time of sintering and a fine grain structure is obtained. Thus a thermoelectric material is obtained having an increased figure of merit. Undesirable anisotropic properties and production loss do not arise. Moreover, since a material in any desired form can be directly produced, miniaturization is realized and one-body molding of a module is possible.

Thus the thermoelectric material obtained by the present invention can be used in a wide variety of fields such as thermoelectric power generation and thermoelectric cooling, a temperature sensor, space development, marine development, and electric power generation in the remote areas.

The present invention is described in greater detail with reference to the following examples and reference examples.

Examples 1 to 14 and Reference Examples 1 and 2

As shown in Table 1, 100 mesh pass raw material (element) powders having various compositions and dopants were prepared and placed in a wet planetary type ball mill to which ethanol had been added, and co-pulverized and mixed for 3 hours. Each powder thus obtained had an average particle diameter of about 1 $\mu$m.

The co-pulverized and mixed powder thus obtained was compression molded under a pressure of 1,000 $kg/cm^2$ and sintered under conditions shown in Table 1. The sintering time was (1) 10 hours or (2) 2 hours.

The heating-up rate was the temperature increase over the time from the sintering temperature (1) to the sintering temperature (2) as shown in Table 1. In Reference Examples 1 and 2, starting material components were alloyed by the conventional melt grown method to form an alloy in place of the above co-pulverization and intermixing, and then the resulting alloy was powdered, molded and sintered.

The evaluation results of figure of merit (Z) as Thermoelectric Characteristics $= \alpha^2 \cdot \sigma / \kappa$, are shown in Table 1:

wherein $\alpha$: Seebeck coefficient,
$\sigma$: electric conductivity
$\kappa$: thermal conductivity.

Examples 15 to 35

As shown in Tables 2 and 3, 100 mesh pass raw material powders having various compositions and dopants were prepared, and pulverized and intermixed for 20 hours by the use of a wet planetary type ball mill to which ethanol had been added. The starting material powder thus obtained had an average particle diameter of about 1 $\mu$m.

The powder thus obtained was compression molded under a pressure of $2.7 \times 10^5$ kPa The green molding thus obtained was sintered and annealed under a sealed condition and conditions shown in the tables to obtain a thermoelectric material.

| Sintering Temperature | n-type: 460° C. |
| | p-type: 470° C. |
| Heating-up rate | 6 hours |
| Temperature Increase Speed | 6 K/hour (at temperatures more than 400° C.) |
| Annealing Temperature | 360° C. |
| Annealing Time | 10 hours |

TABLE 1

| No. | Starting Material Composition (molar ratio) | Type | Dopant | Sintering Conditions Atmosphere | Sintering Temperature (1) (°C.) | Sintering Temperature (2) (°C.) | Heating-up rate (K/hr) | Thermoelectric Characteristics Z* ($K^{-1}$) | $\kappa$* ($Wm^{-1}K^{-1}$) |
|---|---|---|---|---|---|---|---|---|---|
| Example 1 | $Bi_2Te_3$ | n | $SbI_3$ | Ar | 200 | 465 | 6 | $2.0 \times 10^{-3}$ | 0.80 |
| Example 2 | $Bi_2Sb_8Te_{15}$ | n | $SbI_3$ | Ar | 200 | 460 | 5 | $2.2 \times 10^{-3}$ | 0.75 |
| Example 3 | $Bi_2Te_2Se$ | n | $SbI_3$ | Ar | 200 | 460 | 6 | $1.8 \times 10^{-3}$ | 0.75 |
| Example 4 | $Bi_2Te_3$ | n | $SbI_3$ | Ar | — | 465 | 15 | $0.3 \times 10^{-3}$ | 1.0 |
| Example 5 | $Bi_2Sb_2Te_{15}$ | n | $SbI_3$ | Ar | 200 | 460 | 20 | $0.5 \times 10^{-3}$ | 1.2 |
| Example 6 | $Bi_2Te_2Se$ | n | $SbI_3$ | Ar | 200 | 460 | 15 | $0.2 \times 10^{-3}$ | 1.3 |
| Example 7 | $Bi_{1.8}Sb_{0.2}Te_{2.85}Se_{0.15}$ | n | $SbI_3$ | Ar | 200 | 460 | 5 | $2.1 \times 10^{-3}$ | 0.72 |
| Example 8 | $Bi_{1.8}Sb_{0.2}Te_{2.85}Se_{0.15}$ | n | $SbI_3$ | Ar | 200 | 460 | 15 | $0.3 \times 10^{-3}$ | 1.20 |
| Example 9 | $Bi_{1.8}Sb_{0.2}Te_{2.85}Se_{0.15}$ | n | $SbI_3$ | Ar | — | 460 | 5 | $1.6 \times 10^{-3}$ | 0.95 |
| Example 10 | $Bi_{1.8}Sb_{0.2}Te_{2.85}Se_{0.15}$ | n | $SbI_3$ | Ar | 200 | 550 | 5 | $1.2 \times 10^{-3}$ | 1.32 |
| Example 11 | $Bi_{0.5}Sb_{1.5}Te_{2.91}Se_{0.09}$ | p | Te | Ar | 200 | 470 | 5 | $2.0 \times 10^{-3}$ | 0.68 |
| Example 12 | $Bi_{0.5}Sb_{1.5}Te_{2.91}Se_{0.09}$ | p | Te | Ar | 200 | 470 | 15 | $0.1 \times 10^{-3}$ | 1.3 |
| Example 13 | $Bi_{0.5}Sb_{1.5}Te_{2.91}Se_{0.09}$ | p | Te | Ar | — | 470 | 5 | $1.5 \times 10^{-3}$ | 0.93 |
| Example 14 | $Bi_{0.5}Sb_{1.5}Te_{2.91}Se_{0.09}$ | p | Te | Ar | 200 | 550 | 5 | $1.8 \times 10^{-3}$ | 1.10 |
| Reference Example 1 | $Bi_{0.5}Sb_{1.5}Te_{2.91}Se_{0.09}$ | p | Te | Ar | 200 | 470 | 5 | $2.3 \times 10^{-3}$ | 1.60 |
| Reference Example 2 | $Bi_{1.8}Sb_{0.2}Te_{2.85}Se_{0.15}$ | n | $SbI_3$ | Ar | 200 | 460 | 5 | $2.0 \times 10^{-3}$ | 1.65 |

*Z (figure of merit) = $\alpha^2 \cdot \sigma/\kappa$
$\alpha$: seeback coefficients
$\sigma$: electric conductivity
$\kappa$: thermal conductivity

TABLE 2

| No. | Starting Material Composition (molar ratio) | Dopant | Type | Thermal Conductivity Reducing Material (wt %) | Sintering Conditions Atmosphere Gas | Sintering Conditions Pressure* (Torr) | Annealing Conditions Atmosphere Gas | Annealing Conditions Pressure* (Torr) | Figure of merit Z ($K^{-1}$) | Thermal Conductivity $\kappa$ ($Wm^{-1}K^{-1}$) |
| --- | --- | --- | --- | --- | --- | --- | --- | --- | --- | --- |
| Example 15 | $Bi_{1.8}Sb_{0.2}Te_{2.85}Se_{0.15}$ | $SbI_3$ | n | — | Ar | 380 | — | — | $2.4 \times 10^{-3}$ | 1.2 |
| Example 16 | $Bi_{1.8}Sb_{0.2}Te_{2.85}Se_{0.15}$ | $SbI_3$ | n | — | Ar | 0.12 | — | — | $2.5 \times 10^{-3}$ | — |
| Example 17 | $Bi_{1.8}Sb_{0.2}Te_{2.85}Se_{0.15}$ | $SbI_3$ | n | $SiO_2$ 10.0 | Ar | 760 | — | — | $2.4 \times 10^{-3}$ | 1.0 |
| Example 18 | $Bi_{1.8}Sb_{0.2}Te_{2.85}Se_{0.15}$ | $SbI_3$ | n | — | $H_2$ 50% Ar 50% | 760 | — | — | $2.7 \times 10^{-3}$ | — |
| Example 19 | $Bi_{1.8}Sb_{0.2}Te_{2.85}Se_{0.15}$ | $SbI_3$ | n | — | $H_2$ | 760 | — | — | $2.8 \times 10^{-3}$ | — |
| Example 20 | $Bi_{1.8}Sb_{0.2}Te_{2.85}Se_{0.15}$ | $SbI_3$ | n | — | $H_2$ | 380 | — | — | $2.8 \times 10^{-3}$ | — |
| Example 21 | $Bi_{1.8}Sb_{0.2}Te_{2.85}Se_{0.15}$ | $SbI_3$ | n | — | Ar | 760 | $H_2$ 50% Ar 50% | 760 | $2.9 \times 10^{-3}$ | — |
| Example 22 | $Bi_{1.8}Sb_{0.2}Te_{2.85}Se_{0.15}$ | $SbI_3$ | n | — | $H_2$ | 1500 | — | — | $2.9 \times 10^{-3}$ | — |
| Example 23 | $Bi_{0.5}Sb_{1.5}Te_{2.91}Se_{0.09}$ | Te | p | — | Ar | 760 | — | — | $2.4 \times 10^{-3}$ | 1.15 |
| Example 24 | $Bi_{0.5}Sb_{1.5}Te_{2.91}Se_{0.09}$ | Te | p | — | Ar | 0.12 | — | — | $2.5 \times 10^{-3}$ | — |
| Example 25 | $Bi_{0.5}Sb_{1.5}Te_{2.91}Se_{0.09}$ | Te | p | — | $H_2$ | 760 | — | — | $2.8 \times 10^{-3}$ | — |
| Example 26 | $Bi_{0.5}Sb_{1.5}Te_{2.91}Se_{0.09}$ | Te | p | $SiO_2$ 10.0 | Ar | 760 | — | — | $2.4 \times 10^{-3}$ | 0.9 |

*In a sealed condition

TABLE 3

| No. | Starting Material Composition (molar ratio) | Dopant | Type | Thermal Conductivity Reducing Material (wt %) | Sintering Conditions Atmosphere Gas | Sintering Conditions Pressure* (Torr) | Annealing Conditions Atmosphere Gas | Annealing Conditions Pressure* (Torr) | Figure of merit Z ($K^{-1}$) | Thermal Conductivity $\kappa$ ($Wm^{-1}K^{-1}$) |
| --- | --- | --- | --- | --- | --- | --- | --- | --- | --- | --- |
| Example 27 | $Bi_{1.8}Sb_{0.2}Te_{2.85}Se_{0.15}$ | $SbI_3$ | n | — | in Ar gas stream | | $H_2$ | 340 | $2.4 \times 10^{-3}$ | 1.0 |
| Example 28 | $Bi_{1.8}Sb_{0.2}Te_{2.85}Se_{0.15}$ | $SbI_3$ | n | — | in Ar gas stream | | $H_2$ 50% Ar 50% | 340 | $2.4 \times 10^{-3}$ | — |
| Example 29 | $Bi_{1.8}Sb_{0.2}Te_{2.85}Se_{0.15}$ | $SbI_3$ | n | — | Ar 50% $H_2$ 50% | 760 | — | — | $2.7 \times 10^{-3}$ | — |
| Example 30 | $Bi_{1.8}Sb_{0.2}Te_{2.85}Se_{0.15}$ | $SbI_3$ | n | $SiO_2$ 10.0 | in Ar gas stream | | $H_2$ | 340 | $2.4 \times 10^{-3}$ | 0.8 |
| Example 31 | $Bi_{0.5}Sb_{1.5}Te_{2.91}Se_{0.09}$ | Te | p | — | in Ar gas stream | | $H_2$ | 340 | $2.3 \times 10^{-3}$ | — |
| Example 32 | $Bi_{0.5}Sb_{1.5}Te_{2.91}Se_{0.09}$ | Te | p | — | Ar 50% $H_2$ 50% | 760 | — | — | $2.6 \times 10^{-3}$ | — |
| Example 33 | $Bi_{0.5}Sb_{1.5}Te_{2.91}Se_{0.09}$ | Te | p | $SiO_2$ 10.0 | Ar 50% $H_2$ 50% | 760 | $H_2$ | 340 | $2.9 \times 10^{-3}$ | 0.85 |
| Example 34 | $Bi_{1.8}Sb_{0.2}Te_{2.85}Se_{0.15}$ | $SbI_3$ | n | — | in Ar gas stream | | — | — | $2.1 \times 10^{-3}$ | — |
| Example 35 | $Bi_{0.5}Sb_{1.5}Te_{2.91}Se_{0.09}$ | Te | p | — | in Ar gas stream | | — | — | $2.0 \times 10^{-3}$ | — |

*In a sealed condition

What is claimed is:

1. A thermoelectric material obtained by sintering a green molding of a co-pulverized powder mixture of a starting material comprising elemental bismuth, elemental tellurium, 0.1 to 50% by weight of a thermal conductivity reducing material, optionally elemental antimony and optionally elemental selenium.

2. A thermoelectric material according to claim 1, obtained by sintering a green molding a co-pulverized powder mixture of a starting material comprising elemental bismuth, elemental tellurium, elemental antimony and/or elemental selenium.

3. The material as claimed in claim 1 or 2, wherein the molar mixing ratio of (elemental bismuth and elemental antimony when present): (elemental tellurium and elemental selenium when present) is about 2:3.

4. The material as claimed in any one of claims 1 or 2, having a thermal conductivity of not more than 1.4 $Wm^{-1}K^{-1}$.

5. A process for producing a thermoelectric material which comprises co-pulverizing and mixing a starting material comprising elemental bismuth and elemental tellurium, optionally elemental antimony and optionally elemental selenium by the use of a planetary type ball mill or a similar ball mill, and then molding the mixture and sintering the resultant green molding at a heating-up rate of not more than 10 K/hour.

6. The process as claimed in claim 5 wherein the sintering is carried out in a sealed condition.

7. The process as claimed in claim 5 or 6 wherein a reduction treatment by heating in the presence of a reducing gas is carried out at least at any one of co-pulverizing and mixing, and sintering.

8. The process as claimed in claims 5 or 6 wherein the sintering is carried out under reduced pressure.

9. The process as claimed in claims 5 or 6 wherein the molar mixing ratio of (elemental bismuth and elemental antimony when present): elemental tellurium and elemental selenium when present) is about 2:3.

10. The process as claimed in claims 5 or 6 wherein a metal element obtained in the course of scouring is used as the starting material.

11. The process as claimed in any one of claims 5 or 6 wherein the average particle diameter of the resultant powder after copulverizing and mixing is 0.05 to 10 μm.

12. A process for producing a thermoelectric material which comprises co-pulverizing and mixing a starting material comprising elemental bismuth and elemental tellurium, optionally elemental antimony and optionally elemental selenium, molding, sintering and annealing, wherein a reduction treatment by heating in the presence of a reducing gas is applied at least at any one of the co-pulverizing and mixing, sintering and annealing operations, wherein the sintering is conducted at a heating-up of not more than 10 K/hour.

13. The process as claimed in claim 12 wherein the molar mixing ratio of (elemental bismuth and elemental antimony when present): elemental tellurium and elemental selenium when present) is about 2:3.

14. The process as claimed in claim 12 or 13 wherein the average particle diameter of the resultant starting material powder obtained by co-pulverizing and mixing is 0.05 to 5 μm.

15. The thermoelectric material as claimed in claim 1, wherein the particle diameter of one or both of the elemental bismuth and elemental tellurium are 100 mesh pass.

16. The thermoelectric material as claimed in claim 1, wherein in addition to the elemental bismuth and the elemental tellurium, the thermoelectric material also comprises elemental selenium.

17. The thermoelectric material as claimed in claim 15, wherein in addition to the elemental bismuth and the elemental tellurium, the thermoelectric material also comprises elemental antimony, with a molar ratio of Bi:Sb:Te=2:8:15.

18. The thermoelectric material as claimed in claim 15, which further comprises a dopant selected from the group consisting of $SbI_3$, CuTe, $Cu_2S$, CuI, CuBr, AgBr, Te, Cd, Sb, Bi, Pb and As which is added to the starting material of said green compact.

19. The thermoelectric material as claimed in claim 18, wherein the dopant is contained in an amount of 0.01 to 10 mole %.

20. The thermoelectric material as claimed in claim 18, wherein the dopant is contained n an amount of 0.05 to 5 mole %.

21. The thermoelectric material as claimed in claim 1, wherein the thermal conductivity reducing agent is selected from the group consisting of $SiO_2$, $TiO_2$, $ZrO_2$, $B_2O_3$, Bn and $Si_3N_4$.

22. The thermoelectric material as claimed in claim 21, wherein the thermal conductivity reducing agent is in an amount of 0.5 to 30% by weight.

23. The thermoelectric material as claimed in claim 19, wherein the starting material comprises elemental Bi and elemental Te or comprises in addition to the elemental Bi and the elemental Te, one or more of elemental Sb and elemental Se, the dopant is $SbI_3$ and the starting material, expressed in molar ratio is selected from the group consisting of $Bi_2Te_3$, $Bi_2Sb_8Te_{15}$ and $Bi_{1.8}Sb_{0.2}Te_{2.85}Se_{0.15}$.

24. The thermoelectric material as claimed in claim 19, wherein the starting material comprises in addition to the elemental Bi and the elemental Te, elemental Sb and elemental Se, the dopant is Te and the starting material, expressed in molar ratio, is $Bi_{0.5}Sb_{1.5}Te_{2.91}Se_{0.09}$.

25. The thermoelectric material as claimed in claim 1, having a thermal conductivity of 0.7 to 1.3 $Wm^{-1}K^{-1}$.

26. A thermoelectric material according to claim 1 obtained by sintering a green molding of a co-pulverized mixture of a starting material selected from the group consisting of Bi and Te; Bi, Te and Sb; Bi, Te and Se; and Bi, Te, Sb and Se, and comprising a dopant in an amount of up to 10 mol %, said dopant being selected form the group consisting of $SbI_3$, CuTe, $Cu_2S$, CuI, $CuB_2$, AgBr, Te, Cd, Sb, Pb, As and Bi.

27. The thermoelectric material according to claim 26, wherein the dopant is selected from the group consisting of $SbI_3$ and Te.

28. The process as claimed in claim 5, wherein the average particle diameter of the resultant powder after co-pulverizing and mixing is 0.05 to 7 μm.

29. The process as claimed in claim 5, wherein the sintering is conducted at a temperature of 300° to 600° C. and the heating-up rate is 3 to 10 K/hour and the sintering is carried out for a sintering time of 0.5 to 30 hours.

30. The process as claimed in claim 12, wherein the annealing is conducted at a temperature of 50° to 200° C. below the sintering temperature for 0.5 to 30 hours.

* * * * *

UNITED STATES PATENT AND TRADEMARK OFFICE
CERTIFICATE OF CORRECTION

PATENT NO. : 5,108,515
DATED : April 28, 1992
INVENTOR(S) : Ohta, et. al.

It is certified that error appears in the above-indentified patent and that said Letters Patent is hereby corrected as shown below:

Title page, item [73] Assignees:  Before "Tokyo, Japan" insert --and Industry--.
After "Tokyo, Japan" insert-- and Idemitsu Petrochemical Co., Ltd., Tokyo, Japan--.
Column 9, line 36 (Claim 20):  replace "n an" with --in an--.

Signed and Sealed this

Twenty-second Day of November, 1994

Attest:

BRUCE LEHMAN

*Attesting Officer*    Commissioner of Patents and Trademarks